US010599939B2

(12) United States Patent
Gu et al.

(10) Patent No.: US 10,599,939 B2
(45) Date of Patent: Mar. 24, 2020

(54) TOUCH PANEL AND DISPLAY APPARATUS

(71) Applicant: BOE Technology Group Co., Ltd., Beijing (CN)

(72) Inventors: Pinchao Gu, Beijing (CN); Xue Dong, Beijing (CN); Haisheng Wang, Beijing (CN); Chunwei Wu, Beijing (CN); Yingming Liu, Beijing (CN); Rui Xu, Beijing (CN); Changfeng Li, Beijing (CN); Lijun Zhao, Beijing (CN); Yuzhen Guo, Beijing (CN); Yunke Qin, Beijing (CN); Yanan Jia, Beijing (CN); Ping Zhang, Beijing (CN)

(73) Assignee: BOE Technology Group., Ltd., Beijing (CN)

( * ) Notice: Subject to any disclaimer, the term of this patent is extended or adjusted under 35 U.S.C. 154(b) by 71 days.

(21) Appl. No.: 16/069,156

(22) PCT Filed: Dec. 14, 2017

(86) PCT No.: PCT/CN2017/116139
§ 371 (c)(1),
(2) Date: Jul. 10, 2018

(87) PCT Pub. No.: WO2018/214481
PCT Pub. Date: Nov. 29, 2018

(65) Prior Publication Data
US 2019/0354789 A1 Nov. 21, 2019

(30) Foreign Application Priority Data
May 23, 2017 (CN) .......................... 2017 1 0371405

(51) Int. Cl.
*G06K 9/20* (2006.01)
*G06K 9/00* (2006.01)
*H01L 27/32* (2006.01)

(52) U.S. Cl.
CPC ......... *G06K 9/209* (2013.01); *G06K 9/00087* (2013.01); *G06K 9/2036* (2013.01); *G06K 9/0004* (2013.01); *H01L 27/323* (2013.01)

(58) Field of Classification Search
CPC ............ G06K 9/0004; G06K 9/00006–9/0012
See application file for complete search history.

(56) References Cited

U.S. PATENT DOCUMENTS

| 2016/0254312 A1 | 9/2016 | Lee et al. |
| 2017/0193270 A1 | 7/2017 | Zhang |

(Continued)

FOREIGN PATENT DOCUMENTS

| CN | 101814125 A | 8/2010 |
| CN | 104182727 A | 12/2014 |

(Continued)

OTHER PUBLICATIONS

Office Action issued in corresponding Chinese Patent Application No. 201710371405.X, dated May 10, 2019.

(Continued)

*Primary Examiner* — Brian Werner
(74) *Attorney, Agent, or Firm* — McDermott Will & Emery LLP

(57) ABSTRACT

The embodiments of the present disclosure disclose a touch panel and a display apparatus. The touch panel includes a display unit comprising a plurality of pixel units; and a fingerprint recognition sensor disposed on one side of the display unit which is opposite to a light emitting surface of the display unit, wherein the display unit further comprises at least one via hole disposed between two adjacent pixel units, and a light divergence member disposed on one side of each via hole which is close to the fingerprint recognition sensor. The light divergence member is configured to irradiate reflected light obtained as light emitted by the pixel (Continued)

units is reflected by a touch body onto the fingerprint recognition sensor.

20 Claims, 10 Drawing Sheets

(56) References Cited

U.S. PATENT DOCUMENTS

| | | | |
|---|---|---|---|
| 2017/0220844 A1* | 8/2017 | Jones | G06K 9/0053 |
| 2017/0286743 A1* | 10/2017 | Lee | G02B 5/201 |
| 2018/0089491 A1* | 3/2018 | Kim | G06F 3/0412 |
| 2018/0096188 A1 | 4/2018 | Xu | |
| 2018/0157361 A1* | 6/2018 | Kim | G06K 9/0004 |
| 2018/0211085 A1 | 7/2018 | Liu et al. | |

FOREIGN PATENT DOCUMENTS

| | | |
|---|---|---|
| CN | 104182743 A | 12/2014 |
| CN | 105678255 A | 6/2016 |
| CN | 105702176 A | 6/2016 |
| CN | 106298859 A | 1/2017 |
| CN | 206179868 U | 5/2017 |
| CN | 107103307 A | 8/2017 |

OTHER PUBLICATIONS

International Search Report and Written Opinion issued in corresponding International Patent Application No. PCT/CN2017/116139, dated Mar. 23, 2018.

* cited by examiner

TOUCH PANEL AND DISPLAY APPARATUS

This application is a U.S. National Phase of International Application No. PCT/CN2017/116139, filed on Dec. 14, 2017, which claims priority to the Chinese Patent Application No. 201710371405.X, filed on May 23, 2017, each of which is hereby incorporated herein by reference in its entirety.

TECHNICAL FIELD

The embodiments of the present disclosure relate to the field of touch, and more particularly, to a touch panel and a display apparatus.

BACKGROUND

Due to the uniqueness of fingerprint patterns, the developed fingerprint recognition technology is widely used for personal authentication. According to different methods for collecting and inputting a fingerprint, fingerprint recognition technology which is currently applied may comprise optical imaging, heat-sensitive sensors, human body infrared sensors etc. How to more accurately recognize the fingerprint patterns is still a focus issue in the field.

SUMMARY

At least one embodiment of the present disclosure provides a touch panel and a display apparatus.

According to an aspect of the present disclosure, there is proposed a touch panel, comprising:

a display unit comprising a plurality of pixel units; and a fingerprint recognition sensor disposed on one side of the display unit which is opposite to a light emitting surface of the display unit, wherein the display unit further comprises at least one via hole disposed between two adjacent pixel units, and a light divergence member disposed on one side of each via hole which is close to the fingerprint recognition sensor, wherein the light divergence member is configured to irradiate reflected light obtained as light emitted by the pixel units is reflected by a touch body onto the fingerprint recognition sensor.

According to an embodiment of the present disclosure, the display unit further comprises a source/drain layer and a light shielding member disposed on the source/drain layer, and the via hole is formed in the light shielding member.

According to an embodiment of the present disclosure, the display unit further comprises a source/drain layer, and the via hole is formed in the source/drain layer.

According to an embodiment of the present disclosure, the display unit further comprises a light shielding member disposed on one side of the via hole which is away from the fingerprint recognition sensor and configured to guide the reflected light to the via hole.

According to an embodiment of the present disclosure, the light divergence member is disposed so that a virtual focus point of the light divergence member is located at the via hole.

According to an embodiment of the present disclosure, the display unit further comprises a gate insulating layer, and the light divergence member is disposed in the gate insulating layer.

According to an embodiment of the present disclosure, the display unit further comprises a light collimator disposed between the light divergence member and the fingerprint recognition sensor and configured to collimate divergent light from the light divergence member into collimated light which is perpendicularly incident on the fingerprint recognition sensor.

According to an embodiment of the present disclosure, the light divergence member comprises a micro lens.

According to an embodiment of the present disclosure, the at least one via hole comprises a plurality of via holes, and a spacing H between adjacent via holes satisfies the following equation:

$$2 \times D_{image} \times \tan(\alpha+\beta) \leq H \leq 2 \times D_{object} \times \tan(\alpha+\beta)$$

where $D_{object}$ denotes an object distance, $D_{image}$ denotes an image distance, $\alpha$ is a divergence angle of the light divergence member with respect to the reflected light, and $\beta$ is an angle between incident light and an optical axis of the light divergence member.

According to an embodiment of the present disclosure, the spacing H between adjacent via holes is in a range of about 1 mm to 5 mm.

According to an embodiment of the present disclosure, a diameter of the via hole is in a range of about 5 μm to 50 μm.

According to another aspect of the present disclosure, there is provided a display apparatus, comprising the touch panel according to the embodiments of the present disclosure.

According to the embodiments of the present disclosure, the light divergence member is disposed, so that a single via hole may be provided with more corresponding sensors in a case where sizes of sensors included in a fingerprint recognition sensor and a spacing between adjacent sensors are constant, and therefore fingerprint recognition can be realized more accurately.

BRIEF DESCRIPTION OF THE ACCOMPANYING DRAWINGS

In order to more clearly describe the technical solutions in the embodiments of the present disclosure or in the related art, the accompanying drawings required to be used in the description of the embodiments will be briefly described below. It is obvious that the accompanying drawings in the following description are only some embodiments of the present disclosure, and other accompanying drawings can be obtained by those of ordinary skill in the art based on these accompanying drawings without any creative work. In the accompanying drawings:

FIG. 1 illustrates a schematic diagram of a light path for implementing fingerprint recognition in a display area of a touch panel according to an embodiment of the present disclosure;

FIGS. 2A, 2B, and 2C illustrate schematic plan views of a touch panel according to some exemplary embodiments of the present disclosure;

DETAILED DESCRIPTION

In order to make the purposes, technical solutions, and advantages of the embodiments of the present disclosure more clear, the technical solutions in the embodiments of the present disclosure are dearly and completely described below with reference to the accompanying drawings of the embodiments of the present disclosure. Obviously, the described embodiments are only a part but not all of the embodiments of the present disclosure. All other embodiments obtained by those of ordinary skill in the art based on the described embodiments of the present disclosure without any creative work shall fall within the protection scope of the present disclosure. It should be illustrated that throughout the accompanying drawings, the same elements are denoted by the same or similar reference signs. In the following description, some specific embodiments are for illustrative purposes only and are not to be construed as limiting the present disclosure, but merely examples of the embodiments of the present disclosure. The conventional structure or construction will be omitted when it may cause confusion with the understanding of the present disclosure. It should be noted that shapes and dimensions of components in the figures do not reflect true sizes and proportions, but only illustrate contents of the embodiments of the present disclosure.

Unless otherwise defined, technical terms or scientific terms used in the embodiments of the present disclosure should be interpreted in the ordinary sense for those of ordinary skill in the art. The words such as "first," "second," etc. used in the embodiments of the present disclosure do not mean any order, quantity or importance, but merely serve to distinguish different constituent parts.

Fingerprints are invariant features which are unique to individuals and can be distinguished from others. A fingerprint may consist of a series of valleys and ridges on a surface of a skin. The uniqueness of the fingerprint pattern is based on details of these valleys and ridges. A fingerprint recognition function may be implemented in a display area of a touch panel.

Figure 1:
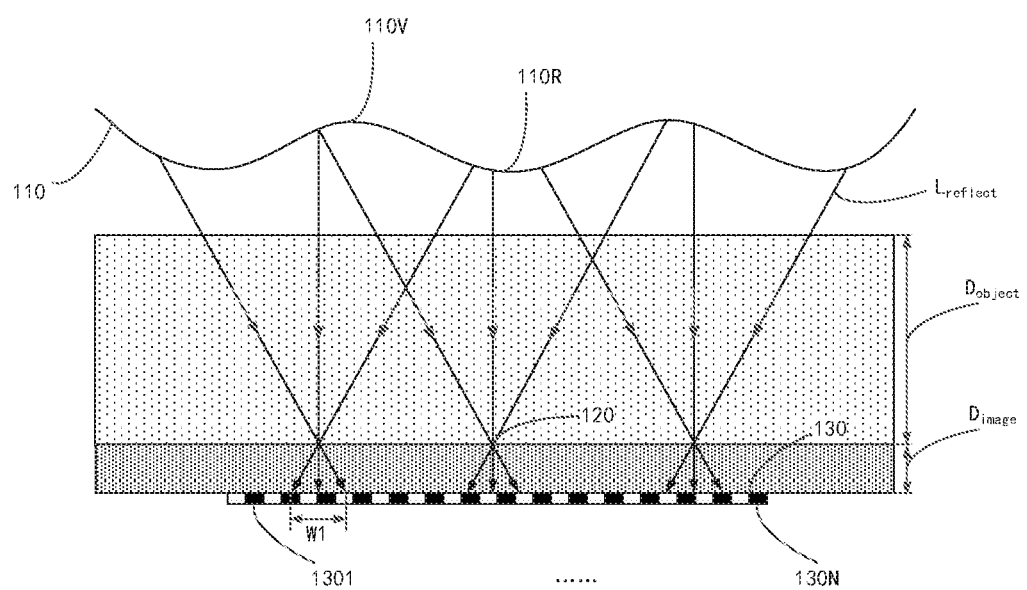

FIG. 1 illustrates a schematic diagram of implementing fingerprint recognition in a display area of a touch panel according to an embodiment of the present disclosure.

As shown in FIG. 1, light emitted by pixel units in the display area of the touch panel is reflected by a touch body 110 which touches or is close to a surface of the touch panel. According to the principle of pinhole imaging, the reflected light $L_{reflect}$ is irradiated onto a fingerprint recognition sensor 130 through at least one via hole 120, and the reflected light is analyzed by the fingerprint recognition sensor 130 so as to obtain an image of a surface of the touch body 110. For example, in a case where the touch body 110 is a finger, the surface of the touch body 110 may comprise valleys 110V and ridges 110R, and light reflected by the valleys 110V and the ridges 110R of the touch body 110 passes through the via hole 120 and have light intensities different from each other. Therefore, the image of the surface of the touch body 110 may be reconstructed by the fingerprint recognition sensor 130 including, for example, a photosensitive sensor, by detecting the reflected light and analyzing received light intensities of the reflected light. According to some embodiments of the present disclosure, the fingerprint recognition sensor 130 may comprise a plurality of sensors 1301-130N, where N is an integer greater than 1, wherein each via hole 120 may correspond to at least one sensor which is distributed within an active region with an area of W1×W1. The larger the W1, the more the number of sensors corresponding to each via hole 120, and the more favorable the recognition of adjacent valleys and ridges in the fingerprint.

However, by taking the pixel units of the touch panel being Organic Light-Emitting Diodes (OLEDs) as an example, layers which result in an object distance $D_{object}$ in FIG. 1 generally comprise a Cover Glass (CG) layer, an Optically Clear Adhesive (OCA) layer, a Thin Film Encapsulation (TFE) layer, a light-emitting layer, etc. in an order from a light emitting surface to a substrate, with a total thickness on the order of hundreds of micrometers. For example, layers which result in an image distance $D_{image}$ in FIG. 1 generally comprise a thin film transistor and a Back Plate (BP), with a total thickness on the order of several micrometers. Therefore, the pinhole imaging system of FIG. 1 has an object distance-to-image distance ratio on the order of several tens to several hundreds. For example, in a practical application, the object distance $D_{object}$ is 700 μm, the image distance $D_{image}$ is 8 μm, and therefore the object distance-to-Image distance ratio $D_{object}/D_{image}=87.5$, which results in that the reflected light $L_{reflect}$ after passing through a single via hole 120 can be irradiated onto a small active region of the fingerprint recognition sensor 130. Therefore there is a small number of sensors corresponding to the single via hole 120, and the recognition accuracy of adjacent valleys and ridges in the fingerprint is not high. In order to enable a single via hole to correspond to sensors as many as possible, sizes of the sensors 1301-130N and/or a spacing between adjacent sensors may be reduced, but this may increases the difficulty of the process and increases the production cost.

Figure 2A:
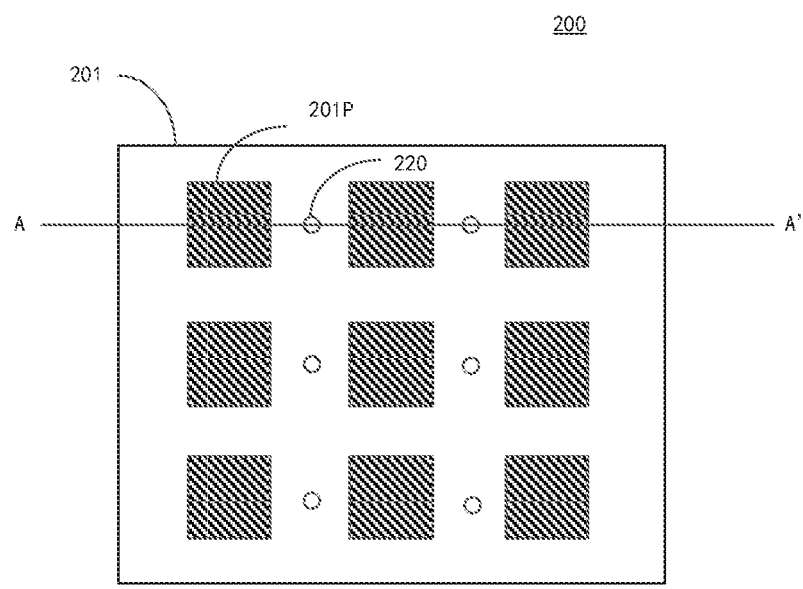
FIG. 2D illustrates a schematic cross-sectional view of the touch panel according to the exemplary embodiment shown in FIG. 2A along A-A'.
FIG. 2E illustrates another schematic cross-sectional view of the touch panel according to the exemplary embodiment shown in FIG. 2A along A-A'.
FIG. 2F illustrates yet another schematic cross-sectional view of the touch panel according to the exemplary embodiment shown in FIG. 2A along A-A'.
Figure 2B:
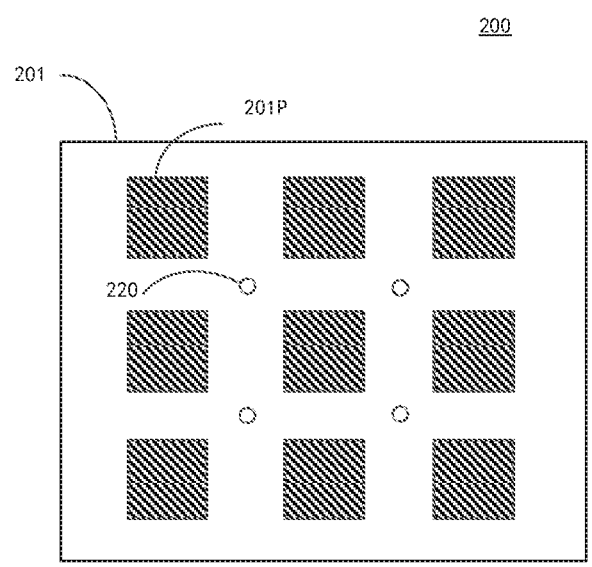
Figure 2C:
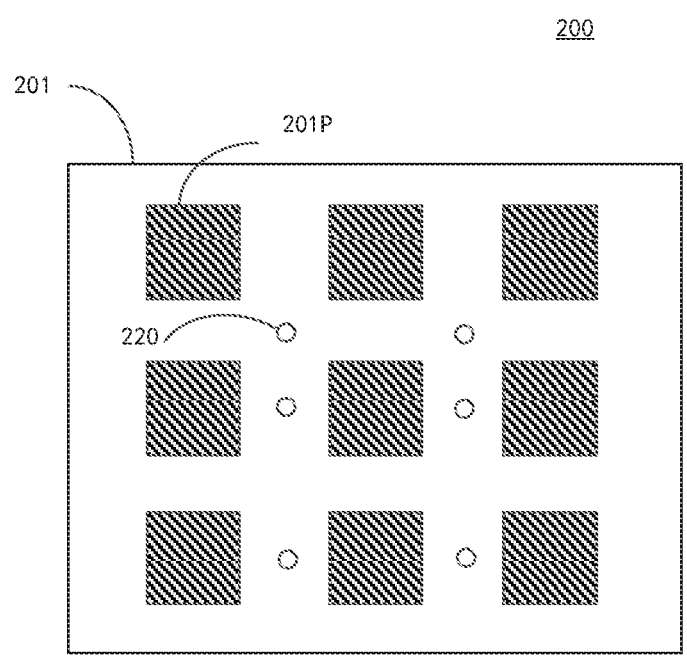

In order to avoid or alleviate the above technical problems, some embodiments of the present disclosure propose a touch panel comprising a display unit and a fingerprint recognition sensor for more accurately recognizing a fingerprint. The display unit comprises a plurality of pixel units. The fingerprint recognition sensor is disposed on one side of the display unit which is opposite to a light emitting surface of the display unit. The display unit further comprises at least one via hole disposed between two adjacent pixel units, and a light divergence member disposed on one side of each via hole which is close to the fingerprint recognition sensor, and light emitted by the pixel units is reflected by a touch body such as a finger etc. The reflected light is irradiated onto the fingerprint recognition sensor through the light divergence member. In this way, as the light divergence member is disposed, it enables a single via hole to be provided with more corresponding sensors, and thus the fingerprint can be more accurately recognized. FIGS. 2A and 2B illustrate schematic plan views of a touch panel according to some exemplary embodiments of the present disclosure. As shown in FIG. 2A, a touch panel 200 according to an embodiment of the present disclosure may comprise a display unit 201, which comprises a plurality of pixel units 201P. At least one via hole 220 is disposed between two adjacent pixel units. FIG. 2A illustrates a case where two adjacent pixel units are adjacent in a horizontal direction and/or in a vertical direction, and FIG. 2B illustrates a case where two adjacent pixel units are adjacent in a diagonal direction. It can be understood by those skilled in the art that "two adjacent pixel units" in the present disclosure comprise, but not limited to, the above two cases. In addition, the embodiments of the present disclosure further comprise any combination of the above two cases, as shown in FIG. 2C.

Figure 2D:
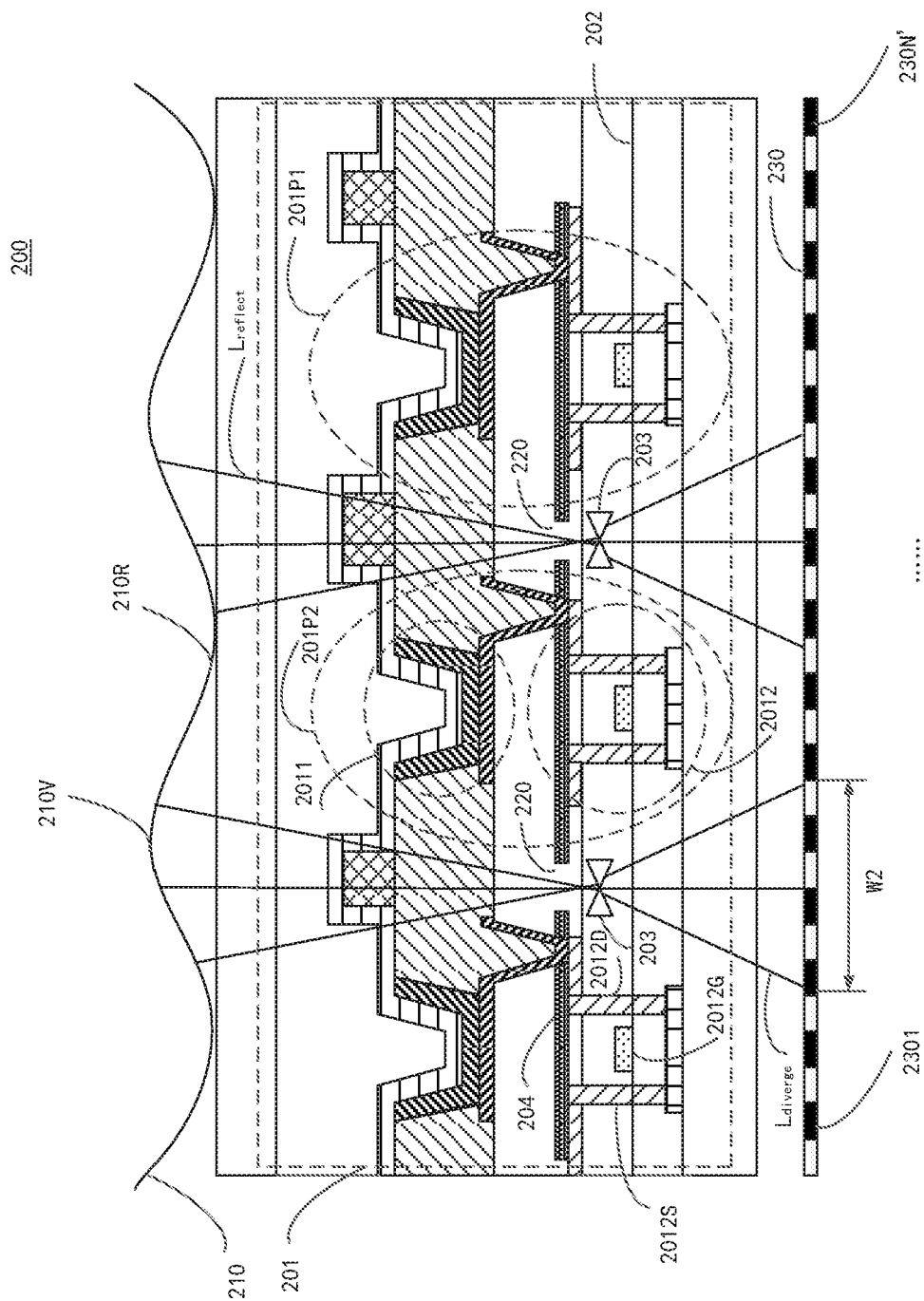

FIG. 2D illustrates a schematic cross-sectional view of the touch panel according to the exemplary embodiment shown in FIG. 2A along A-A'. As shown in FIG. 2D, the touch panel 200 according to an embodiment of the present disclosure may comprise a display unit 201 and a fingerprint recognition sensor 230.

According to the illustrated embodiment, the display unit 201 comprises a plurality of pixel units 201P. The fingerprint recognition sensor 230 is disposed on one side of the display unit 201 which is opposite to a light emitting surface of the display unit 201, for example, below the display unit 201 in FIG. 2D. The display unit 201 further comprises at least one via hole 220 disposed between two adjacent pixel units 201P1 and 201P2, and a light divergence member 203 disposed on one side of each via hole 220 which is close to the fingerprint recognition sensor 230. Light emitted by the pixel units 201P is reflected by a surface of a touch body 210, and the reflected light $L_{reflect}$ is irradiated onto the fingerprint recognition sensor 230 through the light divergence member 203.

The fingerprint recognition sensor 230 analyzes the divergent light $L_{diverge}$ to obtain an image of the surface of the touch body 210. For example, in a case where the touch body 210 is a finger, the surface of the touch body 210 may comprise valleys 210V and ridges 210R. Light reflected by the valleys 210V and the ridges 210R on the surface of the touch body 210 passes through the light divergence member 203 which is disposed correspondingly to the via hole 220. Divergent light obtained after the reflected light is diverged by the light divergence member 203 has different light intensities. The fingerprint recognition sensor 230 may detect the divergent light and analyze received light intensities of the divergent light, so as to reconstruct the image of the surface of the touch body 210. The fingerprint recognition sensor 230 may comprise a plurality of sensors 2301-230N', where N' is an integer greater than 1. A single via hole 220 may correspond to at least one sensor which is distributed in an active region with an area of W2×W2. As the divergent light $L_{diverge}$ is obtained after the reflected light $L_{reflect}$ is diverged by the light divergence member 203, the width W2 is greater than W1 as compared with the example of FIG. 1, and the area of the active region corresponding to the single via hole 220 is greater than that of the active region corresponding to the single via hole 120. Thus, in a case of constant sizes of the sensors and a constant spacing between the sensors, the single via hole 220 may be provided with more sensors, thus facilitating the recognition of adjacent valleys and ridges in the fingerprint.

In FIG. 2D, a light emitting element 2011 being an OLED light emitting element is taken as an example. As shown in FIG. 2D, the pixel units 201P may comprise the light emitting element 2011 and a thin film transistor unit 2012 for switch control. The thin film transistor unit 2012 may comprise a gate 2012G, a source 2012S, and a drain 2012D. It can be understood by those skilled in the art that some structures known in the art are omitted in FIG. 2D for conciseness.

In the exemplary embodiment shown in FIG. 2D, the touch panel 200 may further comprise a light shielding member 204 disposed above a source/drain layer of the display unit, and the via hole 220 is formed in the light shielding member 204. In one embodiment, the light shielding member 204 may be implemented as a light shielding layer. The light shielding member 204 is used to shield reflected light with an excessively large reflection angle, and only reflected light with a relatively small reflection angle may pass through the via hole 220. That is, the reflected light $L_{reflect}$ passing through the via hole 220 is light which is reflected by a part of the touch body facing the via hole 220 as far as possible. Thereby, more accurate fingerprint information is received by the fingerprint recognition sensor 230, which is favorable to the judgment of the valleys and ridges in the fingerprint. The light shielding member 204 may have a material such as metal or black resin, and other light shielding materials may also be selected for use. As shown in FIG. 2D, the light shielding member 204 is disposed to cover the source 2012S and the drain 2012D of the thin film transistor 2012. It can be understood by those skilled in the art that when the light shielding member 204 is implemented using metal, adjacent structures such as the light shielding member 204 and the source/drain layer, an anode of the light emitting element etc. should be insulated from each other. For example, an insulating layer or an insulating film may be disposed between the light shielding member 204 and both the source 2012S and the drain 2012D.

Figure 2E:
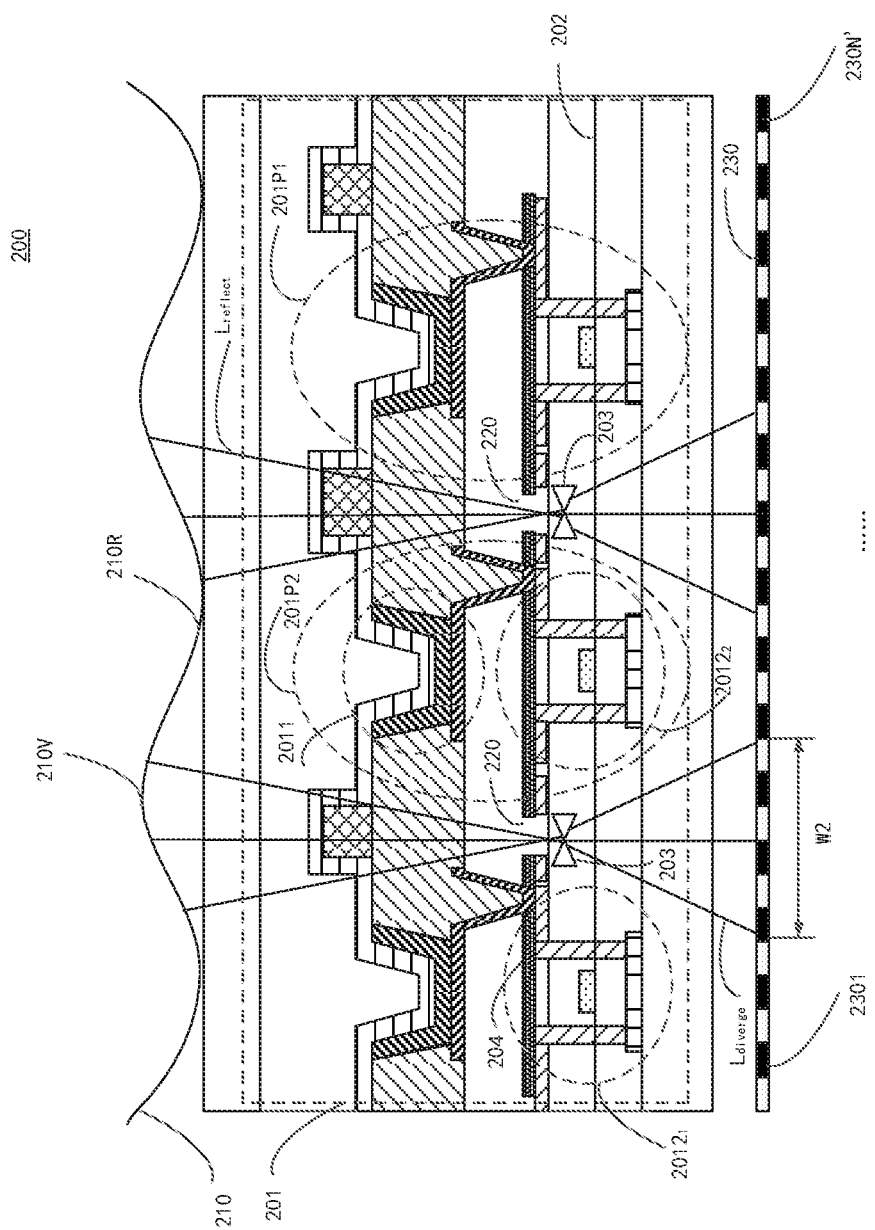

FIG. 2E illustrates another schematic cross-sectional view of the touch panel according to the exemplary embodiment shown in FIG. 2A along A-A'. Unlike the embodiment shown in FIG. 2D, the via hole 220 is formed in the source/drain layer of the display unit in the exemplary embodiment of FIG. 2E. In the exemplary embodiment of FIG. 2E, the via hole 220 is formed in the source/drain layer between two adjacent thin film transistor units 20121 and 20122. It can be understood by those skilled in the art that the source, the drain, a region with the via hole and the via hole may be formed through one patterning process. For the sake of brevity, structures in the exemplary embodiment of FIG. 2E which are the same as or similar to those of FIG. 2D will not be described again.

Figure 2F:
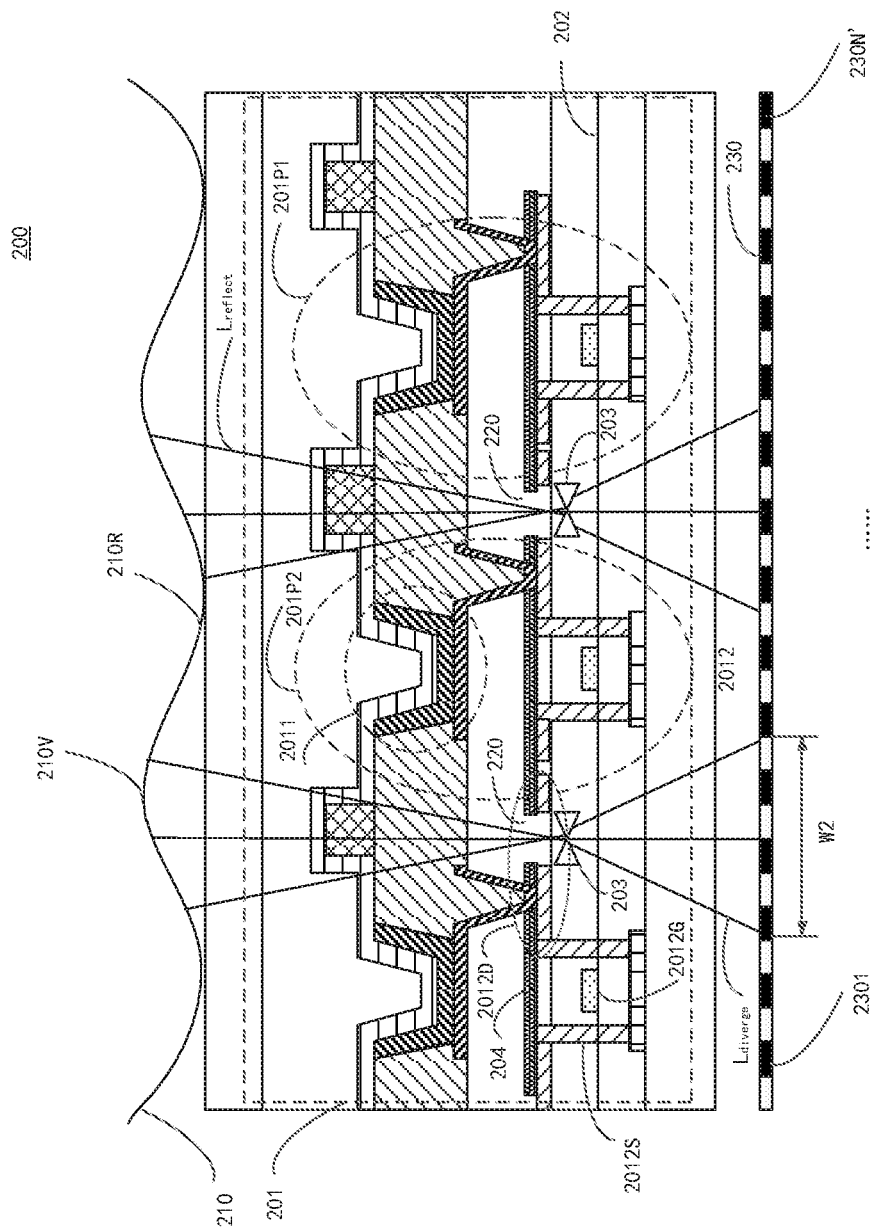

FIG. 2F illustrates yet another schematic cross-sectional view of the touch panel according to the exemplary embodiment shown in FIG. 2A along A-A'. Similarly to the embodiment shown in FIG. 2E, the via hole 220 is formed in the source/drain layer of the display unit in the exemplary embodiment of FIG. 2F. Unlike the exemplary embodiment of FIG. 2E, FIG. 2F illustrates that the via hole 220 is formed in the drain 2012D of the thin film transistor unit. It can be understood by those skilled in the art that the source, the drain and the via hole may be formed through one patterning process. For the sake of brevity, structures in the exemplary embodiment of FIG. 2F which are the same as or similar to those of FIG. 2D will not be described again.

In addition, FIGS. 2E and 2F illustrate that the touch panel 200 comprises a light shielding member 204 disposed on one side of the via hole 220 which is away from the fingerprint recognition sensor 230, for example, above the source/drain layer, and configured to guide the reflected light to the via hole 220. It can be understood by those skilled in the art that the light shielding member 204 may of course not be included.

In addition, the via hole 220 may also be formed in a gate layer of the display unit. For example, the via hole 220 is formed in a gate layer between two adjacent thin film transistor units. It can be understood by those skilled in the art that the gate, a region with the via hole and the via hole may be formed through one patterning process.

According to an embodiment of the present disclosure, the touch body 220 may comprise any object capable of implementing touch, such as a finger, a toe, etc. The present embodiment is primarily described by taking the touch body being a finger as an example.

Figure 3A:
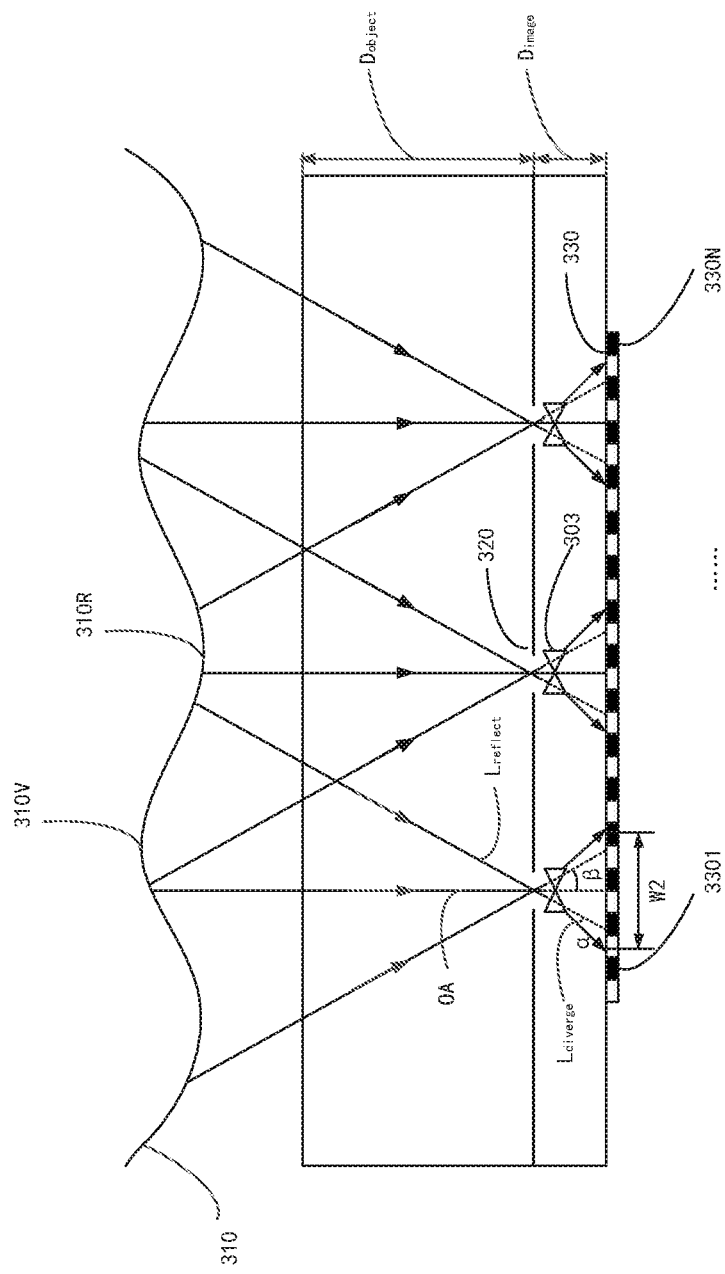
FIG. 3A illustrates a schematic diagram of a light path for implementing fingerprint recognition in a touch panel according to an exemplary embodiment of the present disclosure.

FIG. 3A illustrates a schematic diagram of a light path for implementing fingerprint recognition in a touch panel according to an exemplary embodiment of the present disclosure. Hereinafter, embodiments of the present disclosure will be described in further detail with reference to FIGS. 2D-2F and 3A. As shown in FIG. 3A, for example, in a case where the touch body 310 is a finger, a surface of the touch body 310 may comprise valleys 310V and ridges 310R, and light $L_r$ reflected by the valleys 310V and the ridges 310R on the surface of the touch body 310 passes through a light divergence member 303 which is disposed correspondingly to a via hole 320. The light divergence member 303 diverges the reflected light $L_{reflect}$. The fingerprint recognition sensor 330 may comprise a plurality of sensors 3301-330N', where N' is an integer greater than 1. The single via hole 320 may correspond to at least one sensor which is distributed in an active region with a width of W2, and the corresponding at least one sensor detects divergent light $L_{diverge}$ obtained after the reflected light $L_{reflect}$ is diverged by the light divergence member 303. A plurality of sensors 3301-330N' may be implemented as photosensitive sensors.

According to an embodiment of the present disclosure, at least one via hole 320 may comprise a plurality of via holes, and a diameter of a single via hole is in a range of several μm to several tens of μm, for example, 1 μm-100 μm or 5 μm-50 μm. As the diameter range is sufficiently large, light passing through the via hole 320 may not be diffracted. In some embodiments, the plurality of via holes may have the same diameter.

Figure 3B:
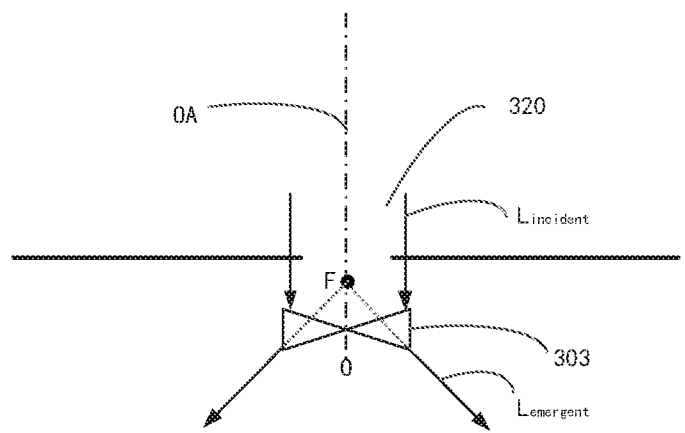
FIG. 3B illustrates a partial enlarged view of the schematic light path shown in FIG. 3A.

FIG. 3B illustrates a partial enlarged view of the schematic light path shown in FIG. 3A. As shown in FIG. 3B, according to an embodiment of the present disclosure, the light divergence member 303 is disposed so that a virtual focal point F of the light divergence member 303 is located at the via hole 320. In FIG. 3B, O is an optical center of the light divergence member 303, and OA is an optical axis of the light divergence member 303. Parallel incident light $L_{incarident}$ is diverged by the light divergence member 303 into exit light $L_{emergent}$ with a virtual focus point at F. A focal length of the light divergence member 303 may be selected as long as the incident light can be diverged and the divergent light corresponding to the same via hole does not overlap on different sensors.

According to an embodiment of the present disclosure, a spacing between two adjacent via holes is in a range of 1 mm to 5 mm. The larger the spacing between the via holes, the smaller the number of via holes which can be provided. If there is a small number of via holes, it is difficult to image the entire surface of the touch body. If there is a large number of via holes, the light passing through adjacent via holes 320 may overlap on the same sensor, which causes signal crosstalk and thus results in inaccurate detected information. According to an embodiment of the present disclosure, the spacing H between adjacent via holes may satisfy the following relationship:

$$2 \times D_{image} \times \tan(\alpha+\beta) \leq H \leq 2 \times D_{object} \times \tan(\alpha+\beta)$$

where $D_{object}$ denotes an object distance, $D_{image}$ denotes an image distance, α is a divergence angle of the light divergence member 303 with respect to incident light (i.e., reflected light from the surface of the touch body 310), and β is an angle between the incident light and the optical axis OA. The object distance $D_{object}$ may be a vertical distance from the surface of the touch body to the via hole, and the image distance $D_{image}$ may be a vertical distance from the via hole to a plane where the fingerprint recognition sensor is located. When $H \geq 2 \times D_{image} \times \tan(\alpha+\beta)$, light passing through different via holes may be prevented from overlapping on the same sensor and causing signal crosstalk. When $H \leq 2 \times D_{object} \times \tan(\alpha+\beta)$, it can be ensured that the entire touch body is imaged. In order for a photosensitive sensor in the fingerprint recognition sensor to obtain a sufficient amount of light, via holes may be provided as many as possible while satisfying the above equation.

For example, by taking the area of the fingerprint being 20*30 mm² as an example, when a spacing between adjacent via holes is 1 mm, it needs to provide a 20×30 array of holes to realize full fingerprint recognition; and when the spacing between the adjacent via holes is 5 mm, it needs to provide a 4×6 array of holes to realize full fingerprint recognition. In addition, it can be understood by those skilled in the art that the via hole may be disposed at any position of the display area according to practical requirements. The via holes may also be evenly or unevenly disposed in the display area of the touch panel as shown in FIGS. 2A, 2B, and 2C or in any other form.

As shown in FIGS. 2D to 2F, according to an embodiment of the present disclosure, the light divergence member may comprise a micro lens, which may be formed in the gate insulating layer 202 of the display unit. The micro lens may be formed on a gate insulating layer in, for example, an OLED. It can be understood by those skilled in the art that, for example, the micro lens may be formed using a touch mask method, electron beam direct writing, an ink jet printing method, ion etching, a laser direct writing method, embossing, ion exchange, hot melting, a precipitation method, etc. By taking ion etching as an example, after a layer of material required for forming the micro lens is deposited, photoresist is applied, and then the photoresist is exposed using a mask with holes. According to the development and disappearance characteristics of positive photoresist under light, a region of the micro lens which is exposed by the photoresist is ion-etched, and then a shape of a concave lens is formed by using the step characteristics during etching. The micro lens may be formed together with a material of the insulating layer through patterning in sequence. For example, after the insulating layer is deposited, the material of the insulating layer is directly used to form the micro lens. A diameter of the micro lens may be slightly greater than that of the via hole, which enables light passing through the via hole to enter the micro lens.

Figure 4:
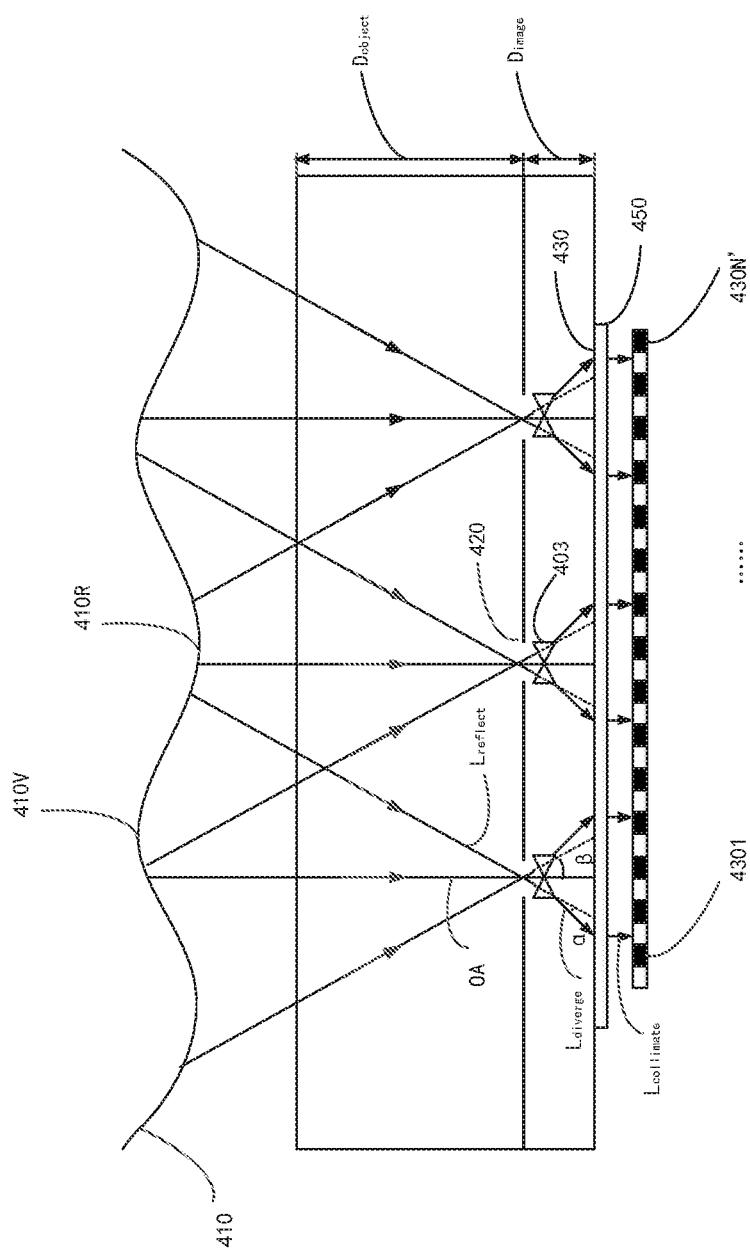
FIG. 4 illustrates a schematic diagram of a light path for implementing fingerprint recognition in a touch panel according to another exemplary embodiment of the present disclosure.

FIG. 4 illustrates a schematic diagram of a light path for implementing fingerprint recognition in a touch panel according to another exemplary embodiment of the present disclosure. As shown in FIG. 4, light emitted by light emitting units is reflected by valleys 410V and ridges 410R on a surface of a touch body 410, and the reflected light $L_{reflect}$ passes through a light divergence member 403 disposed in a via hole 420. The reflected light $L_{reflect}$ is diverged by the light divergence member 403, and the divergent light $L_{diverge}$ reaches a plurality of sensors 4301-430N' of a fingerprint recognition sensor 430. The plurality of sensors 4301-430N' may be implemented as photosensitive sensors. A light intensity of light after the reflected light $L_{reflect}$ reaches the sensors 4301-430N' through various film layer structures is reduced. At the same time, the reflected light $L_{reflect}$ passes through the via hole 420 and the light divergence member 403. Due to different incident angles, different reflection and absorption may occur for light with different incident angles when it passes through the via hole 420 and the light divergence member 403. As shown in FIG. 4, the light which is incident along a direction of an optical axis OA of the light divergence member 403 has the smallest light intensity. As the incident angle increases, the light intensity of the light incident on the light divergence member 403 increases. Especially for the photosensitive sensor, because of the problem of the refractive index of the surface film medium, after light with a certain angle is irradiated onto a surface of a device, a part of the light may be reflected or refracted, which results in a decrease in the light conversion efficiency. This results in a high photoelectric conversion efficiency of a photosensitive sensor directly below the via hole 420, and the farther a photosensitive sensor deviates from this position, the lower the photoelectric conversion efficiency of the photosensitive sensor is. That is, the greater the incident angle, the greater the loss of light intensity of the light received by the corresponding photosensitive sensor. As the photosensitive sensor judges valleys and ridges of a fingerprint according to a difference between the received light intensities, it may interfere with the judgment of the valleys and ridges of the fingerprint. Therefore, according to an embodiment of the present disclosure, the touch panel 400 may further comprise a light collimator 450 disposed between the light divergence member 403 and the fingerprint recognition sensor 430. As shown in FIG. 4, the divergent light $L_{diverge}$ incident on the light collimator 450 at different angles is collimated into collimated light $L_{collimate}$ perpendicularly irradiated onto the fingerprint recognition sensor 430, which improves the consistency between the light intensity of the light received by the photosensitive sensor of the fingerprint recognition sensor 430 and the light intensity of the reflected light $L_{reflect}$, and at the same time, enables the divergent light $L_{diverge}$ obtained through the via hole 420 and the light divergence member 403 to be more evenly irradiated onto the corresponding photosensitive sensor. However, it can be understood by those skilled in the art that the light collimator 450 is not necessary. For example, in a case where a thickness of the touch panel needs to be reduced and the photosensitive sensor is insensitive to the incident angle of light, the light collimation member 450 may be omitted.

Figure 5:
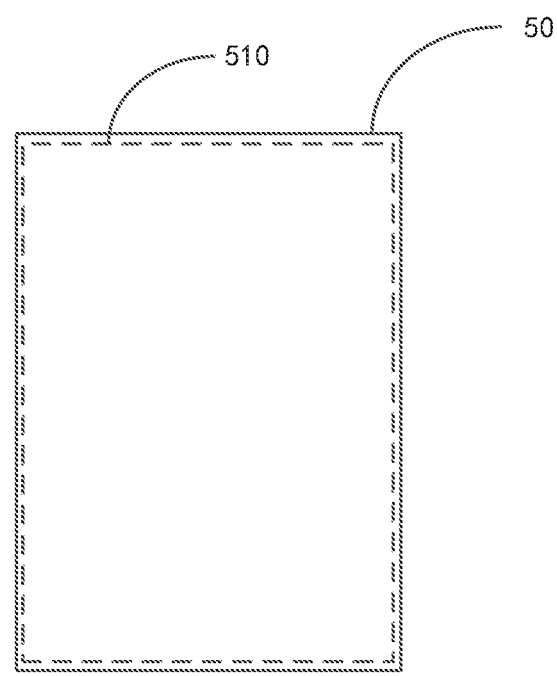
FIG. 5 illustrates a display apparatus according to an exemplary embodiment of the present disclosure.

FIG. 5 illustrates a display apparatus according to an exemplary embodiment of the present disclosure. As shown in FIG. 5, the display apparatus 50 comprises a touch panel 510, which is formed as the touch panel as described in the above embodiments, for example.

The display apparatus 50 according to an embodiment of the present disclosure may be any product or component having a display function such as an electronic paper, a mobile phone, a tablet computer, a television, a display, a notebook computer, a digital photo frame, a navigator, etc.

According to the embodiments of the present disclosure, the light divergence member is disposed, so that a single via hole may be provided with more corresponding sensors in a case where sizes of sensors included in a fingerprint recognition sensor and a spacing between adjacent sensors are constant, and therefore fingerprint recognition can be realized more accurately.

Although the present disclosure has been specifically illustrated and described with reference to the exemplary embodiments of the present disclosure, it should be understood by those of ordinary skill in the art that these embodiments may be changed variously in forms and details without departing from the spirit and scope of the present disclosure defined by the appended claims.

We claim:
1. A touch panel, comprising:
a display unit comprising a plurality of pixel units; and
a fingerprint recognition sensor disposed on one side of the display unit which is opposite to a light emitting surface of the display unit,
wherein the display unit further comprises at least one via hole disposed between two adjacent pixel units, and a light divergence member disposed on one side of each via hole which is close to the fingerprint recognition sensor, wherein the light divergence member is configured to irradiate reflected light, obtained as light emitted by the pixel units is reflected by a touch body, onto the fingerprint recognition sensor.

2. The touch panel according to claim 1, wherein the display unit further comprises a source/drain layer and a light shielding member disposed on the source/drain layer, and the via hole is formed in the light shielding member.

3. The touch panel according to claim 1, wherein the display unit further comprises a source/drain layer, and the via hole is formed in the source/drain layer.

4. The touch panel according to claim 3, wherein the display unit further comprises a light shielding member disposed on one side of the via hole which is away from the fingerprint recognition sensor and configured to guide the reflected light to the via hole.

5. The touch panel according to claim 1, wherein the light divergence member is disposed so that a virtual focus point of the light divergence member is located at the via hole.

6. The touch panel according to claim 1, wherein the display unit further comprises a gate insulating layer, and the light divergence member is disposed in the gate insulating layer.

7. The touch panel according to claim 1, wherein the display unit further comprises a light collimator disposed between the light divergence member and the fingerprint recognition sensor and configured to collimate divergent light from the light divergence member into collimated light which is perpendicularly incident on the fingerprint recognition sensor.

8. The touch panel according to claim 1, wherein the light divergence member comprises a micro lens.

9. The touch panel according to claim 1, wherein the at least one via hole comprises a plurality of via holes, and a spacing H between adjacent via holes satisfies the following equation:

$$2 \times D_{image} \times \tan(\alpha+\beta) \leq H \leq 2 \times D_{object} \times \tan(\alpha+\beta)$$

where $D_{object}$ denotes an object distance, $D_{image}$ denotes an image distance, $\alpha$ is a divergence angle of the light divergence member with respect to the reflected light, and $\beta$ is an angle between incident light and an optical axis of the light divergence member.

10. The touch panel according to claim 9, wherein the spacing H between adjacent via holes is in a range of about 1 mm to 5 mm.

11. The touch panel according to claim 1, wherein a diameter of the via hole is in a range of about 5 μm to 50 μm.

12. A display apparatus, comprising the touch panel according to claim 1.

13. The display apparatus of claim 12, wherein the display unit further comprises a source/drain layer and a light shielding member disposed on the source/drain layer, and the via hole is formed in the light shielding member.

14. The display apparatus of claim 12, wherein the display unit further comprises a source/drain layer, and the via hole is formed in the source/drain layer.

15. The display apparatus of claim 14, wherein the display unit further comprises a light shielding member disposed on one side of the via hole which is away from the fingerprint recognition sensor and configured to guide the reflected light to the via hole.

16. The display apparatus of claim 12, wherein the light divergence member is disposed so that a virtual focus point of the light divergence member is located at the via hole.

17. The display apparatus of claim 12, wherein the display unit further comprises a gate insulating layer, and the light divergence member is disposed in the gate insulating layer.

18. The display apparatus of claim 12, wherein the display unit further comprises a light collimator disposed between the light divergence member and the fingerprint recognition sensor and configured to collimate divergent light from the light divergence member into collimated light which is perpendicularly incident on the fingerprint recognition sensor.

19. The display apparatus of claim 12, wherein the light divergence member comprises a micro lens.

20. The display apparatus of claim 12, wherein the at least one via hole comprises a plurality of via holes, and a spacing H between adjacent via holes satisfies the following equation:

$$2 \times D_{image} \times \tan(\alpha+\beta) \leq H \leq 2 \times D_{object} \times \tan(\alpha+\beta)$$

where $D_{object}$ denotes an object distance, $D_{image}$ denotes an image distance, $\alpha$ is a divergence angle of the light divergence member with respect to the reflected light, and $\beta$ is an angle between incident light and an optical axis of the light divergence member.

* * * * *